United States Patent [19]

Taylor, Jr. et al.

[11] E Patent Number: Re. 33,333

[45] Reissued Date of Patent: Sep. 11, 1990

[54] DIGITAL AUDIO AMPLIFIER HAVING A HIGH POWER OUTPUT LEVEL AND LOW DISTORTION

[75] Inventors: Wilson E. Taylor, Jr.; Larry E. Hand, both of Meridian, Miss.

[73] Assignee: Peavey Electronics Corporation, Meridian, Miss.

[21] Appl. No.: 211,217

[22] Filed: Mar. 11, 1988

Related U.S. Patent Documents

Reissue of:

[64] Patent No.: 4,600,891
Issued: Jul. 15, 1986
Appl. No.: 643,315
Filed: Aug. 21, 1984

[51] Int. Cl.[5] ..... H03F 3/38

[52] U.S. Cl. ..... 330/10; 330/207 A; 330/251

[58] Field of Search ..... 330/10, 207 A, 207 P, 330/251, 298; 332/109, 110, 112, 115, 116

[56] References Cited

U.S. PATENT DOCUMENTS

| | | | |
|---|---|---|---|
| 4,178,556 | 12/1979 | Attwood | 330/10 |
| 4,182,992 | 1/1980 | Attwood | 330/251 |
| 4,476,436 | 10/1984 | Koizumi et al. | 330/251 X |
| 4,509,101 | 4/1985 | Kenji | 330/10 X |

OTHER PUBLICATIONS

Design Parameters Important for Optimization of Very High Fidelity PWM (Class D) Audio Amplifiers; Attwood; AES; Mar. 2-5, 1982.

Very High Fidelity Quartz Controlled PWM (Class D) Stereo Amplifiers for Consumer & Professional Use; Attwood; Feb.-Mar. 1978, AES.

A 0.5 MHz Switching DC-AC Inverter Topology Provides Low EMI Environments for Critical Spacecraft Applications; Attwood, Apr. 10-12, 1984.

*Primary Examiner*—Steven Mottola

*Attorney, Agent, or Firm*—Huff & Associates

[57] ABSTRACT

A digital amplifier having a modulator for transforming the analog audio input signal into two complimentary trains of pulse width modulated signals for driving the power switches, which modulator utilizes a precision triangular waveform to control the transformation. The modulator employs all differential processing without saturated transistors to achieve a minimal distortion modulation system. Upon the occurrence of overmodulation, pulses from the width modulated pulse train produced by the modulator are dropped, and the resulting loss of pulses is detected and fed back to a variable gain amplifier stage of the system. The distortion detection system for detecting the missing pulses utilizes a timing network to establish the missing pulse period necessary to begin input attenuation of the audio signal by the variable gain amplifier stage. A reconstruction filter includes a low-pass section for recovering the amplified audio and a notch filter section having notches centered to eliminate the fundamental of the switching frequency. A variable inductor is employed in connection with a section of the notch filter for aiding in the proper notching of the signals to maximize suppression of the switching frequency, such inductor being coupled to the feedback network, and is adjusted by the operator while observing output distortion until the distortion attains a minimum level. The reconstruction filter also includes a tapped inductor functioning as an autotransformer which introduces offsets in the output switching waveform of the power amplifier to effectively compensate for crossover distortion due to energy recovery diode overswings and power switch voltage drops.

41 Claims, 4 Drawing Sheets

DIGITAL AUDIO AMPLIFIER HAVING A HIGH POWER OUTPUT LEVEL AND LOW DISTORTION

Matter enclosed in heavy brackets [ ] appears in the original patent but forms no part of this reissue specification; matter printed in italics indicates the additions made by reissue.

BACKGROUND OF THE INVENTION

The present invention relates to the field of high fidelity audio-amplifiers, and more particularly such amplifiers employing digital techniques.

Audio-amplifiers have been marketed in the past, wherein the analog audio signal to be amplified is converted into pulse trains which are modulated in accordance with the analog signal, such pulse trains being amplified by power switching amplifiers, and the output thereof being applied to low-pass filters for reconstructing the audio signal thus amplified. However, the results produced by such amplifiers currently on the market are deemed to be below the level of excellence of sound reproduction desired.

It is an object of the present invention to provide an extremely high fidelity audio-amplifier employing audio signal modulated pulse trains which are amplified to high power output levels, and yet producing very low distortion (less than 0.1%) and a minimal degree of feedback (approximately 22 dB).

In conventional audio-amplifiers, the input and output waveforms are scaled and compared for differences, and these differences are thresholded to achieve distortion detection. In accordance with the amplifier of the present invention, this process is simplified whereby the input audio signal is converted into a sequence of high frequency pulses which control power switches, which in turn apply amplified pulse trains to a reconstruction filter to reconstruct the amplified audio input. The power switches employed for amplification function in a digital manner with their transistors fully saturated or fully cutoff, so as to operate most efficiently, and the various features of the invention result in the aforesaid level of excellence.

SUMMARY OF THE INVENTION

The above stated objects of the invention are accomplished in the preferred embodiment by providing a modulator for transforming the analog audio input signal into two complementary trains of pulse width modulated signals for driving the power switches, which modulator utilizes a precision triangular waveform to control the transformation. The modulator employs all differential processing without saturated transistors to achieve a minimal distortion modulation system. Upon the occurrence of over-modulation, pulses from the width modulated pulse train produced by the modulator are dropped, and the resulting loss of pulses is detected and fed back to a variable gain amplifier stage of the system. The signal resulting from the detection of missing pulses by the missing pulse or distortion detector reduces the system input gain and signal level and can limit system distortion for up to 20 dB of input overdrive. The distortion detection system for detecting the missing pulses is coupled between the modulator and a voltage controlled attenuator and utilizes a timing network to establish the missing pulse period necessary to begin input attenuation of the audio signal by the variable gain amplifier stage.

The reconstruction filter includes a low-pass section for recovering the amplified audio and a notch filter section having notches centered to eliminate the fundamental of the switching frequency. A variable inductor is employed in connection with a section of the notch filter for aiding in the proper notching of the signals to maximize surpression of the switching frequency, such inductor being coupled to the feedback network, and is adjusted by the factory while observing output distortion until the distortion attains a minimum level. The reconstruction filter also includes a tapped inductor functioning as an autotransformer which introduces offsets in the output switching waveform of the power amplifier to effectively compensate for crossover distortion due to energy recovery diode overswings and power switch voltage drops. This circuit increases system efficiency by eliminating series diodes formerly necessary to prevent forward conduction of integral body drain diodes in the power MOSFETS used as switching elements in the power amplifier. Also, a short circuit protection circuit employs a mono-stable multivibrator (MSMV) which is triggered upon the detection of excessive audio current and inhibits the operation of the modulator within 2 microseconds, thereby to immediately inhibit the application of input pulses to the power switching amplifiers until the multi-vibrator is re-enabled after a fixed time delay.

Other objects, features and advantages of the present invention will become apparent upon study of the following description taken in conjunction with the drawings in which:

FIG. 1 discloses the overall organization of the circuitry of the preferred embodiment of the invention;

SPECIFIC DESCRIPTION

Figure 1:
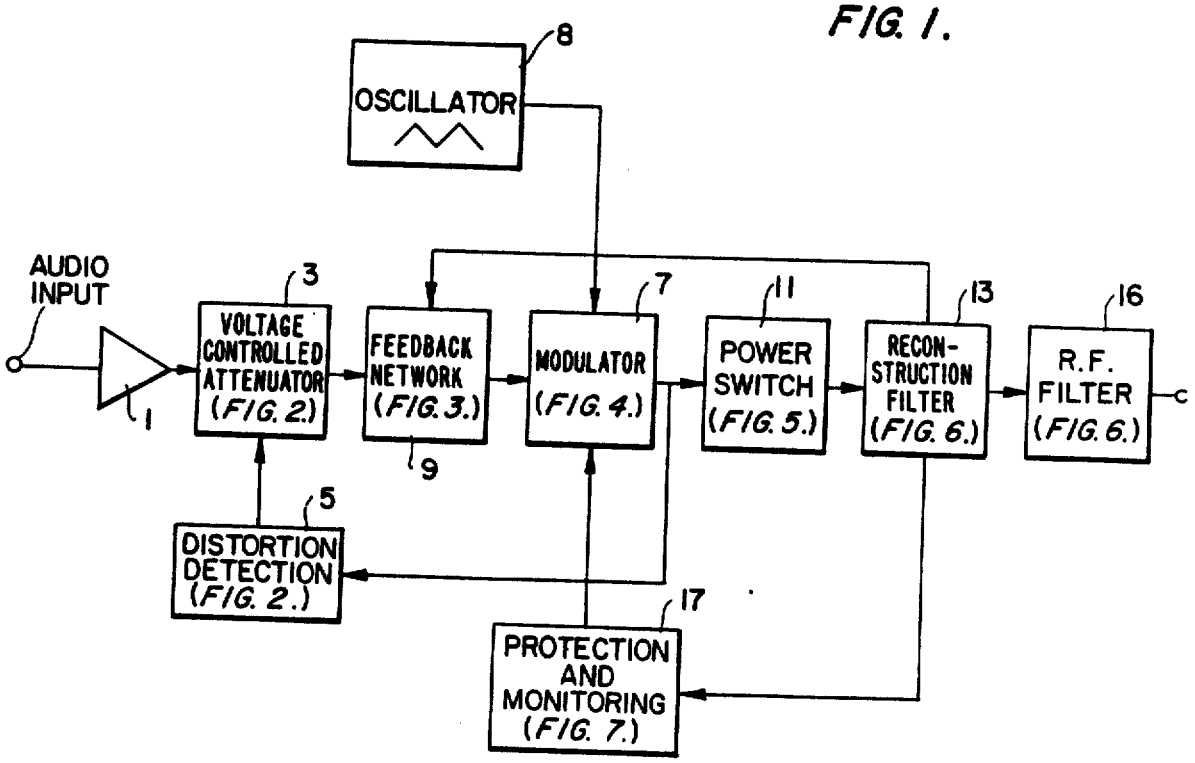

Referring now to FIG. 1, illustrating the overall digital energy conversion amplifier (DECA), an audio input is amplified by input amplifier 1 and is transmitted to voltage controlled attenuator 3 which is normally set in the "no attenuation state". In this state this circuit contributes less than 0.001% of the total distortion, although it is capable of up to 20 dB of attenuation, with less than 1% distortion. The audio signal is applied to the DECA modulator 7 via a feedback network 9. Network 9 consists of a series of lag/lead circuits for shaping the overall response of the amplifier which are designed to give an overall amplifier bessel response. Modulator 7 converts the incoming analog signal into a series of digital pulses which are pulse width modulated. This conversion is accomplished by comparing the input analog data to a fixed frequency sampling signal produced by oscillator 8. The signal is preferably a triangular wave, which permits double edge modulation of the applied signal, thus reducing distortion for a given sampling frequency. A level slicing technique of the triangular waveform is produced as described below to produce two pulse width modulated trains which are applied to power switch 11 which amplifies these pulse trains. The power switches are employed in a digital manner with their transistors fully saturated or fully off to maintain maximum efficiency of operation. The resulting amplified signals, having slew rates in excess of 5000 volts/microsecond, are applied to reconstruction filter 13 which functions to retrieve the D.C. component of the amplified pulse trains which is a replica of the audio-input signal. Filter 13 employs a low pass filter network to eliminate the undesirable high frequency content of the amplified pulse trains while retaining the high quality analog data, and includes several notch filters, centered to eliminate the fundamental and third harmonic of the pulse train, and also employs an autotransformer co-acting with energy recovering diodes, to produce circulating current which forces the high power switching transistors in power switch circuitry 11 to operate in their most efficient switching region. A radio frequency filter 16 is coupled to the output circuit of filter 13 to completely eliminate the residual pulse train signals which may otherwise be present.

A drop in the frequency of the digital pulse trains developed in modulator 7 occurs when the analog input from feedback network 9 exceeds the amplitude of the triangular waveform. This action is due to output clipping caused by the application of an analog signal which is greater than the amplifier can reproduce at nominal gain. The occurrence of clipping, reduces the frequency of the digital pulse train developed by modulator 7, and a timing circuit within distortion detection unit 5, is employed to forward a signal to voltage controlled attenuator 3 which attenuates the input audio signal pursuant to the reduction of frequency of the pulse trains developed in modulator 7. Modulator 7 utilizes differential processing without employing saturated transistors, thereby to achieve a minimal distortion modulation system. Protection and monitoring circuitry 17 disables the drive signal pulse trains generated in modulator 7, within 1 microsecond, in the event of a fault condition. For example, a short circuit condition produces excessive current through the reconstruction filter, which is employed to actuate a MSMV to inhibit the operation of the digital pulse train amplifying circuitry in modulator 7. The MSMV is automatically reset after a short time, and is again set upon the occurrence of a new fault condition.

Figure 2:
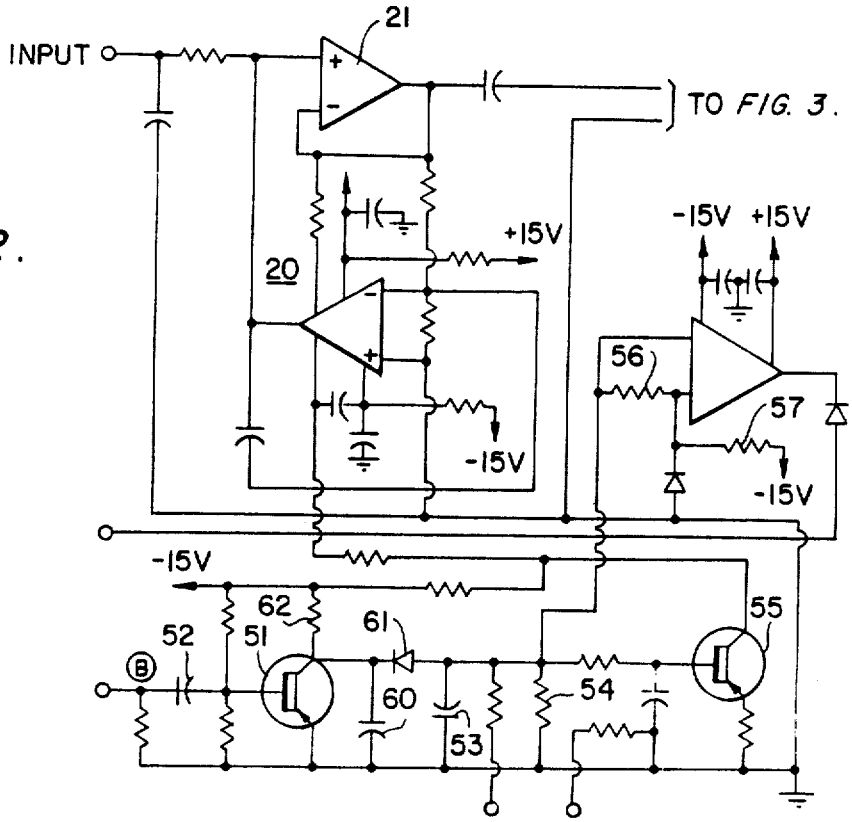
FIG. 2 illustrates the voltage controlled attenuator together with the missing pulse detector for controlling the attenuator.
Figure 4:
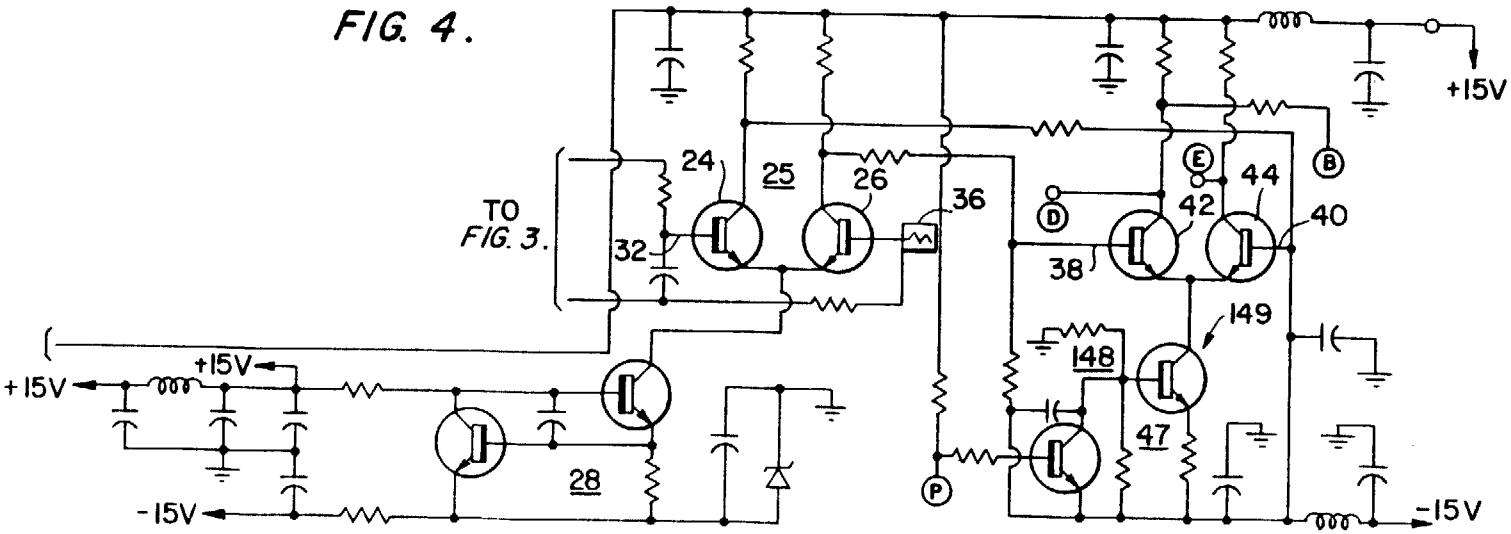
FIG. 4 illustrates the modulator.

Referring now to FIG. 2, input amplifier 21 receives the audio-input signal which is transmitted through amplifier 22 and 23 of the feedback network designated 9 in FIG. 2. FIG. 4, which is directed toward the DECA modulator, includes a pair of transistors 24 and 26 coupled to current source 28 and functioning as a comparator. The amplified audio signal produced at the output terminal 31 of amplifier 23 of the feedback network is applied to the base 32 of comparator transistor 24. Triangular waveform pulse generator 36 is coupled to the base of transistor 26, and in accordance with the level slicing modulation operation of the present invention, a series of pulse trains will be produced at the collectors of transistors 24 and 26 which are fed to the inputs 38 and 40 of the amplifier of FIG. 4 comprising transistors 42 and 44 which transistors function to amplify the pulse width modulated trains produced by transistors 24 and 26. The emitters of transistors 42 and 44 are coupled to a current source 47 which may be employed to rapidly shut off the supply of current to transistors 42 and 44 in accordance with fault conditions to be described below.

Figure 8:
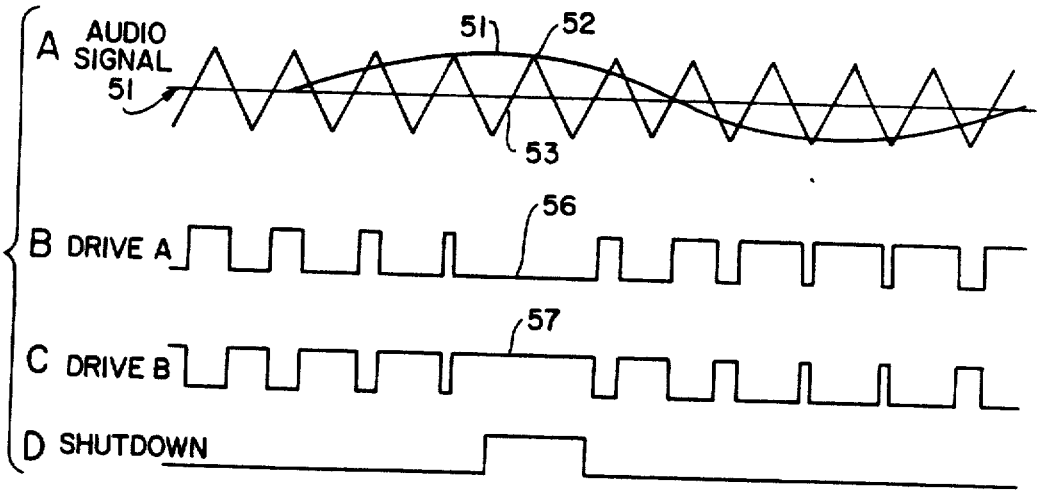
FIGS. 8A–8D illustrates certain waveforms which are helpful in the understanding of the operation of the modulator of FIG. 4.

The drive waveforms are produced in accordance with the level slicing technique by comparator 25 which generates the pair of pulse width modulated output signals of FIG. 8B and 8C which serve as complementary drive signals for transistors 42 and 44 which in turn will ultimately drive the power switching amplifiers discussed below. The variable audio signal is applied through amplifiers 22 and 23 to the base of transistor 24 which functions in a non-saturating mode, while the triangular waveform show in FIG. 8A from generator 36 is applied to the base of transistor 26 of comparator 25. As indicated by FIGS. 8A through 8C, the comparator 25 produces pairs of pulse width modulated signals having transistions corresponding to the cross-over points of the triangular waveform with regard to the variable audio signal shown in FIG. 8A. As audio signal 51 increases as shown at the left-hand portion of FIG. 8A, the duty cycle of the positive going drive pulses of FIG. 8B will be reduced although their frequency will remain the same; likewise with respect to the negative going pulse train of FIG. 8C generated by the level slicing technique of comparator 25. The audio signal 51 may at some point such as at 52 exceed the amplitude of triangular waveform 53, and the operation of comparator 25 will result in the absence of a pulse as indicated at 56 of FIG. 8B and 57 in FIG. 8C. This condition is caused by output clipping due to the application of an audio-input signal greater than the level that the amplifier may reproduce at nominal gain and the result is a drop in the frequency of the pulse train indicated at 56 and 57 occurring when the audio signal exceeds the peak-to-peak amplitude of 53. This condition will be detected by the distortion detection circuit 5 of FIG. 1 to be explained below. Should the audio signal 52 become more negative than the bottom portion of the triangular waveforms, pulses will again be dropped to indicate an overdrive condition of the amplifier. The pulse trains of FIG. 8B and 8C are applied to the input terminals 38 and 40 of the amplifier including transistors 42 and 44, wherein the pulse train is amplified and transmitted to the input circuits of the push-pull solid state pulse train amplifiers of FIG. 5.

Thus in accordance with the level slicing technique of the present invention executed by the structure of FIG. 4, a periodic waveform is applied to one input terminal of comparator 25 and a signal proportional to the audio input signal is applied to the input terminal of transistor 24. It is important to note that the modulator of FIG. 4 does not employ saturated transistors, and differential processing without saturation achieves minimal distortion with respect to the modulation of the audio signal.

The circuit comprising the lower portion of FIG. 2 has its input terminal B coupled to terminal B of transistor 42. As a result, the waveform generated by the modulator and amplified by amplifier 42, is applied to the base of transistor 51 via capacitor 52 at the lower portion of FIG. 2. Distortion detector 5 of FIG. 1 may be found at the lower portion of FIG. 2, which functions to forward a signal to the voltage controlled attenuator 20 upon the detection of missing pulses due to overdrive as explained above. This action causes attenuation of the input signal to eliminate the over modulation condition. The nature of attenuator 20 is known to workers in the art; see U.S. Pat. No. 4,318,053.

The generation of pulses indicated in FIGS. 8B and 8C cause transistor 51 to turn on and off. The negative voltage initially stored in integrating capacitor 53 is determined by a voltage divider consisting of resistors 54, 56 and 57. This reference voltage stored by capacitor 53 will prevent transistor 55 from turning on to cause the voltage controlled attenuator 20 to attenuate the audio signal applied to the feedback network. The continued application of pulses of the pulse train, where pulses are not missing, causes the actuation of transistor 51 to in turn prevent substantial buildup of a negative voltage across capacitor 60 so that diode 61 remains back biased. However, upon the occurrence of a missing pulse condition or state, transistor 51 will remain off and capacitor 60 will charge up through resistor 62 to forward bias diode 61 and to cause a further buildup of the negative voltage across capacitor 53 via diode 61 which in turn results in the increase in collector current of transistor 55 coupled to the voltage controlled attenuator. This action will cause the attenuator to reduce the magnitude of the audio input signal to prevent the overdrive condition. Thus it may be seen that resistor 62 and capacitor 60 will form a timing network which determine the missing pulse period necessary to actuate transistor 55 to in turn produce attenuation of the audio input signal. With no current from transistor 55 the signal gain of the voltage controlled attenuator is unity and as the current produced by transistor 55 increases, the gain is reduced by up to 20 dB at maximum attenuation.

Figure 5:
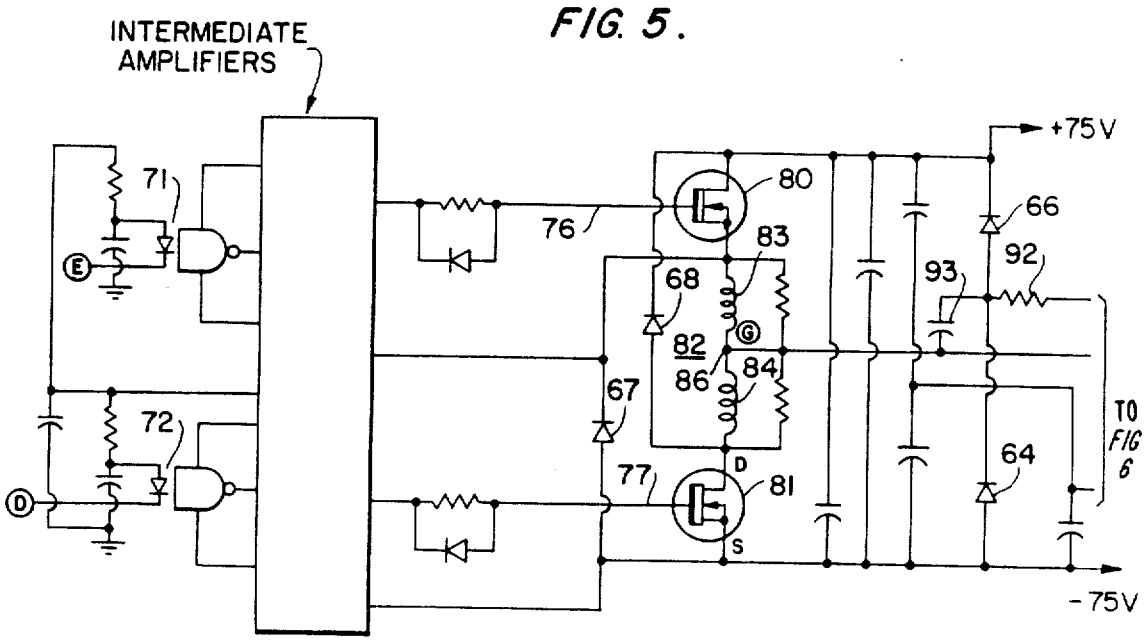
FIG. 5 illustrates the power switching circuitry.

The power switches of FIG. 5 function to amplify the output waveforms produced upon the collectors of transistors 42 and 44 of FIG. 4. Terminal D of transistor 42 is coupled to terminal D of FIG. 5 whereas terminal E of transistor 44 is coupled to terminal E of FIG. 5. Optical isolation switching elements 71 and 72, actuated in accordance with the output pulse trains produced by the modulator transistors 42 and 44, are coupled, via intermediate amplifiers, to the input circuits of high power MOSFET elements 80 and 81 in the push-pull power amplifier circuit 82. The drain of field effect element 80 is coupled to +75 volts, whereas the source terminal of element 81 is coupled to a −75 volt bus. The output of the push-pull high current power amplifier is taken at terminal G which is the center tapped junction point between inductors 83 and 84.

Figure 6:
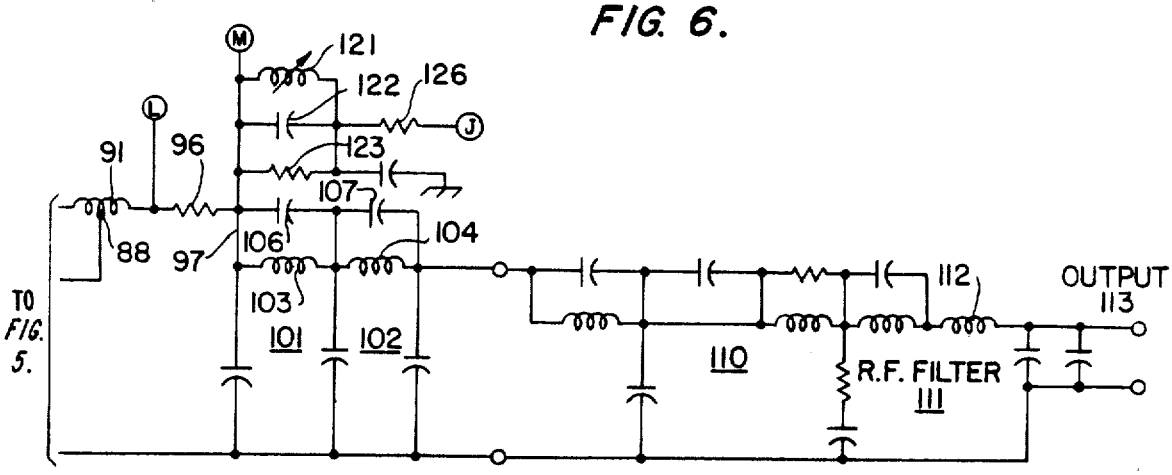
FIG. 6 illustrates the reconstruction filter and R.F. filter at the output of the system.

Referring now to FIG. 6 which discloses the various sections of reconstruction filter 13 of FIG. 1, terminal G is coupled to a tap 88 of tapped inductor or autotransformer 91. The left-hand terminal of inductor 91 is coupled to terminal G via resistor 92 and capacitor 93, while the right-hand terminal of autotransformer 91 is coupled to resistor 96 which is in turn coupled to the input 97 of the notch filter portion of low-pass filter network; sections 101 and 102 thereof include inductors 103, 104 and capacitors 106 and 107. FIG. 6 further includes low-pass filter stage 110 terminating at an R.F. frequency filtering stage 111, acting in accordance with the invention, to completely eliminate any residual pulse train signals which might be present at the system output. The right hand portion of inductor 112 is coupled to output terminal 113 of the system. The low-pass filter, having the components listed below, consists of a fundamental low pass filter with a Chebyshev characteristic coupled to a series of notch filters, centered to eliminate the fundamental frequency of the triangular waveform (500 kHz) and the third harmonic of the pulse train.

Figure 3:
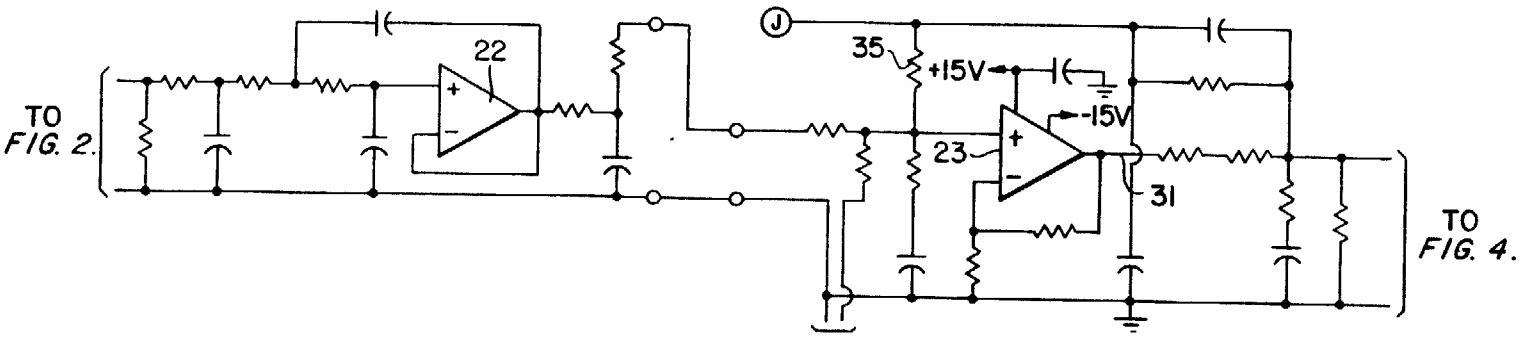
FIG. 3 illustrates the feedback network.

A further feature of the invention employs variable inductor 121, coupled in parallel with capacitor 122, to form a high Q sharp notch filter which is centered approximately at 500 kHz. There is a tendency however for the notch filters to become phase shifted at about the 500 KHz center line and this is used to cause an increase in the efficiency of suppression of the pulse train frequency. Thus, variable inductor 121, is coupled to terminal J of the FIG. 3 feedback network and coupled in turn to the upper input terminal of amplifier 23 via resistor 35. The output 113 of the system is examined for distortion, and inductor 121 is adjusted to change its inductance which affects the feedback signal, until the scope observed distortion is reduced to a minimum during testing. This process is facilitated by including a damping resistor 123, which reduces the Q of the LC circuit including inductor 121. Thus, the signal fed back to terminal J of the feedback network by adjustable inductor 121, is employed to substantially eliminate the closed loop distortion of the output at 113 of FIG. 6. The notch rejection section of the reconstruction filter also includes fixed capacitors 106 and 107, coupled in parallel with inductors 103 and 104 as shown.

In accordance with an additional feature of the invention, tapped inductance 91 of FIG. 6, functioning as an autotransformer, performs crossover distortion correction in the output switching waveform generated by the push-pull power MOSFETS 80 and 81 by transformer action which causes the tapped left hand-portion of the inductor to insert offsets into the switched waveform to effectively buck the crossover distortions resulting from a number of sources such as energy recovery diode overshoots and the MOSFET "on" resistances. System efficiency is increased by eliminating series diodes necessary to prevent forward conduction of the integral body drain diodes in the power MOSFETS. The crossover distortion is produced by energy recovery diode overswings and the on resistances of the MOSFETS. The preferred compensation circuit includes having tap 88 of the autotransformer 91 coupled to amplifier center-tap 86 of the amplifier output reactance comprising inductors 83 and 84. Back biased diodes 64 and 66, coupled across the supply busses and coupled to autotransformer 91 via resistor 92, function to insert the compensation offsets into the waveform, cooperating back biased diodes 67 and 68 being coupled across the amplifier components as shown. Thus, the autotransformer functions as a floating battery source for inserting circulating currents back into the power amplifier via resistor 92, diodes 64 and 66, and the remaining amplifier switching circuit elements.

Figure 7:
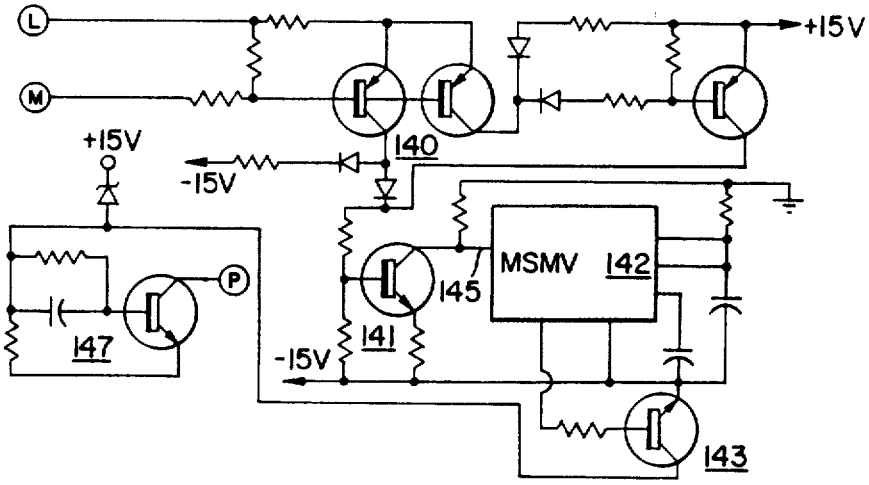
FIG. 7 illustrates the protection circuit.

The protection and monitoring circuitry 17 of FIG. 1, corresponds to FIG. 7 disclosing circuitry for providing protection against the failure of transistor output devices such as the power MOSFETS 80 and 81 or due to other abnormally high currents. In accordance with this feature of the invention, terminals L and M of FIG. 7 are coupled to terminals L and M of FIG. 6 which will produce a voltage across them indicative of the current passing through resistor 96, of the reconstructed DC signal. Should the current through resistor 96 indicating a serious fault be excessive, the resulting voltage impressed across terminals L and M in FIG. 7 will cause MSMV 142 to become triggered, since its input terminal 145 is coupled to the output terminal of switching device 141 which in turn is coupled to terminals L and M via switching device 140. Thus a threshold voltage, produced by excessive current through the reconstruction filter resistor 96, will trigger the MSMV 142, to cause a change of state in switching devices 143 and 147 in tandom therewith. The change of state of switching device 147 will actuate switching devices 148 and 149 in the modulator section of FIG. 4; the collector of switching device 147, namely terminal P, is coupled to terminal P of the switching device 148. The result is an interruption of the current supply normally provided by transistor 149 to the modulator amplifier at the right-hand portion of FIG. 4, and as a result, no further pulses will be impressed upon terminals D and E which are coupled to the input circuits of the power switches of FIG. 5 discussed above. The described arrangement will thus sense excessive current in the amplified audio signal and shut down the system modulator within two microseconds to prevent output device failure. Owing to the recovery period of MSMV 142 the modulator is re-enabled after a fixed time delay, and will of course again inactivate the modulator should the high current fault condition persist. The result is a complete fast acting protection against output short circuit faults and the like.

Thus it should now be appreciated that the aforesaid inventive features of the novel digital energy conversion amplifier, cooperate to provide a very high efficiency system for audio amplification whereby high output power levels, with extremely low distortion (less than 0.1%), and a minimal amount of feedback (approximately 22 dB), have been achieved.

The following is a listing of selected component values utilized in the product to be marketed by the assignee of the present invention:

Capacitor 52: 180 pf
Capacitor 60: 0.047 mfd
Resistance 62: 10K
Resistance 54: 220K
Capacitor 55: 0.015 mfd
Inductor 33: 8 uH
Inductor 84: 0.8 uH
Tapped Inductor 91: 18 uH
Resistor 92: 3 ohms
Resistor 96: 0.03 ohms
Variable Inductor 121: 0.3 uH to 1 uH
Capacitor 122: 0.22 mfd
Resistor 123: 47 ohms
Capacitor 106: 0.2 mfd
Inductor 103: 0.46 uH
Resistor 126: 100 ohms
Capacitor 107: 0.33 mfd
Inductor 104: 0.6 uH
Autotransformer 91: 18 uH
Resistor 92: 0.3 ohms
Capacitor 93: 470 pf
Diodes 64,66,67,68: rur 820
FETS 80,81: irf 240
Inductors 83,86: 0.8 uH.

The above described embodiments of the invention are merely exemplary, and it should be understood that numerous equivalents to the above described circuitry may be employed by those skilled in the art rather than those specified. Thus the scope of the invention is to be limited only by the language of the following claims and art recognized equivalents.

We claim:

1. In a digital energy conversion high fidelity audio amplifier having an audio signal source for producting an audio frequency analog signal to be amplified, voltage controlled attenuation means, a modulator for converting said analog signals to pulse width modulated trains of pulses, power amplifier means for amplifying said pulse width modulated trains of pulses, and reconstruction filter means for recovering the analog signals from said width modulated trains of pulses:

comparator means within said modulator having a first and second input terminal for producing a pulse train, width modulated in accordance with the amplitude of said analog singal, means for coupling a serrated waveform pulse generator to the first input terminal of said comparator and having a given sampling frequency, together with means for coupling said audio signal to the second input terminal of said comparator, and wherein said comparator includes a first non-saturating differential amplifier, and a second non-saturating differential amplifier having input terminals thereof coupled to the output terminals of said first differential amplifier.

2. In a digital energy conversion high fidelity audio amplifier having an audio signal source for producing an audio frequency analog signal to be amplified, voltage controlled attenuation means, a modulator for converting said analog signals to pulse width modulated trains of pulses, power amplifier means for amplifying said pulse width modulated trains of pulses, and reconstruction filter means for recovering the analog signals from said width modulated trains of pulses:

comparator means within said modulator having a first and second input terminal for producing a pulse train, width modulated in accordance with the amplitude of said analog signal, means for coupling a serrated waveform pulse generator to the first input terminal of said comparator and having a given sampling frequency, together with means for coupling said audio signal to the second input terminal of said comparator, further including missing pulse detection means having an input circuit for detecting a state of missing pulses within the pulse train produced by said comparator means indicative of clipping of the audio signal being amplified, and for producing an output signal indicative of missing pulse occurrences; and means for coupling said output signal of said missing pluse detection means to said voltage controlled attenuator means for attenuating said audio signal passing therethrough to prevent said clipping.

3. The combination as set forth in claim 2 wherein said missing pulse detection means further includes a timing circuit for establishing a reference time interval indicative of said state of missing pulses and for producing said output signal only upon the absence of pulses, normally applied to said input circuit of said missing pulse detection means, during a time duration greater than said reference time interval.

4. The combination as set forth in claim 3 further including switching means for reinitiating timing by said timing circuit upon the application of a pulse applied to the input circuit of said missing pulse detection means.

5. The combination as set forth in claim 3 wherein said missing pulse detection means includes integrating means for producing an increasing signal with time and which functions to produce said output signal upon said increasing signal exceeding a given level and switching means for inhibiting the buildup of said increasing signal upon the detection of a pulse applied to the input circuit of said missing pulse detection means.

6. The combination as set forth in claim 5 wherein said timing circuit comprises a resistor and reactor having a given time constant proportional to said reference time interval indicative of said state of missing pulses.

7. In a digital energy conversion high fidelity audio amplifier having an audio signal source for producing an audio frequency analog signal to be amplified, voltage controlled attenuation means, a modulator for converting said analog signals to pulse width modulated trains of pulses, power amplifier means for amplifying said pulse width modulated trains of pulses, and reconstruction filter means for recovering the analog signals from said width modulated trains of pulses:

comparator means within said modulator having a first and second input terminal for producing a pulse train, width modulated in accordance with the amplitude of said analog signal, means for coupling a serrated waveform pulse generator to the first input terminal of said comparator and having a given sampling frequency, together with means for coupling said audio signal to the second input terminal of said comparator, further including a protection circuit for very rapidly disabling said modulator, including a sensing means for sensing excessive audio current being amplified, together with inhibit switching means coupled to said sensing means for generating a fixed interval inhibit signal upon the sensing of excessive audio current by said sensing means, and means for coupling said inhibit signal to said modulator for inhibiting the operation thereof.

8. The combination as set forth in claims 2, 3 or 4 wherein the serrated waveform has an isosceles triangular configuration and peak-to-peak voltage levels which exceed the amplitude of said audio signal until the occurrence of over modulation to produce said state of missing pulses.

9. In a digital energy conversion audio amplifier having an audio signal source for producing an audio waveform to be amplified, a feedback network, a modulator for converting said analog signals to pulse width modulated trains of pulses, power amplifier means for amplifying said pulse width modulated trains of pulses: reconstruction filter means for recovering the audio waveform from said width modulated trains of pulses, said reconstruction filter means having low-pass filter means for recovering said audio signal amplified by said power amplifier means and notch filter means for eliminating at least the fundamental frequency component of the switching frequency of said power amplifier means.

10. The combination as set forth in claim 9 further including variable reactor means for tuning at least one section of said notch filter means, and means for coupling said variable reactor to said feedback network to enable reduction of output distortion by observing the output signal from said audio amplifier while actuating said variable reactor means.

11. The combination as set forth in claim 10 further including damping means coupled to said variable reactor means for damping the Q of said section of said notch filter to facilitate the observation and correction of said output signal.

12. In a digital energy conversion audio amplifier having an audio signal source for producing analog signals to be amplified, voltage controlled attenuation means, a feedback network, a modulator for converting said analog signals to a pulse width modulated train of pulses, power amplifier means for amplifying said pulse width modulated train of pulses, and reconstruction filter means, said power amplifier means including a push-pull power amplifier having a negative power supply bus and a positive power supply bus and first and second amplifier devices coupled in series across said positive and negative power supply bus, first reactance means coupled between said first and second amplifier devices and having a center tap, and push-pull amplifier crossover distortion compensation means comprising:

second inductive reactance means, coupled between said center tap of first said reactance means and said reconstruction filter, and having a first and second output terminal and a tap;

first coupling means for coupling said tap of said second reactance means to said center tap of said first reactance means;

second coupling means for coupling said first terminal of said second inductive reactance means to said reconstruction filter;

third coupling means for coupling said second terminal of said second inductive reactance means to one of said power supply busses via a first diode;

fourth coupling means for coupling said second terminal of said second inductive reactance means to the other power supply bus via a second diode, said first and second diodes being back biased with respect to the polarity of the voltages upon said busses.

13. The combination as set forth in claim 12 further including a third back biased diode coupled across said first reactance means and one of said amplifying devices together with a fourth back biased diode coupled across said first reactance means and the other of said amplifying devices.

14. The combination as set forth in claim 13 wherein said first reactance means comprises first and second inductors coupled together at said center tap.

15. In a digital energy conversion high fidelity audio amplifier having an audio signal source for producing analog signals to be amplified, voltage controlled attenuation means, a feedback network, a modulator for converting said analog signals to a pulse width modulated train of pulses, power amplifier means for amplifying said pulse width modulated train of pulses and reconstruction filter means for recovering the analog signals from said width modulated trains of pulses:

comparator means within said modulator for producing pulse trains, width modulated in accordance with the amplitude of said analog signal, having first and second switching devices, each having an input terminal, an output terminal and a control terminal, together with means for coupling said switching devices together in a non-saturating common terminal differential amplifier configuration, and further including a serrated waveform pulse generator coupled to the control terminal of said first switching device and having a given sampling frequency together with means for coupling said audio signal to the control terminal of said second switching device but not to the control terminal of said first switching device.

16. The combination as set forth in claim 15 further including a second common terminal non-saturating differential amplifier having input terminals thereof coupled to the output terminals of said first and second switching devices of said first differential amplifier and having a common terminal current source, together with a disable circuit for disabling said second differential amplifier as long as an inhibit signal is applied thereto.

17. The combination as set forth in claim 15 further including missing pulse detection means having an input circuit for detecting a state of missing pulses within the pulse train produced by said comparator means indicative of clipping of the audio signal being amplified, and for producing an output signal indicative of missing pulse occurrences; and means for coupling said output signal of said missing pulse detection means to said voltage controlled attenuator means for attenuating said audio signal passing therethrough to prevent said clipping.

18. The combination as set forth in claim 17 wherein said missing pulse detection means further includes a timing circuit for establishing a reference time interval indicative of said state of missing pulses and for producing said output signal only upon the absence of pulses, normally applied to said input circuit of said missing pulse detection means, during a time duration greater than said reference time interval.

19. The combination as set forth in claim 18 further including switching means for reinitiating timing by said timing circuit upon the application of a pulse applied to the input circuit of said missing pulse detection means.

20. The combination as set forth in claim 18 wherein said missing pulse detection means further includes an integrating device for producing an increasing signal with time and which functions to produce said output signal upon said increasing signal exceeding a given level and switching means for inhibiting the buildup of said increasing signal upon the detection of a pulse applied to the input circuit of said missing pulse detection means.

21. The combination as set forth in claim 20 wherein said timing circuit comprises a resistor and reactor having a given time constant proportional to said reference time interval indicative of said state of missing pulses.

22. The combination as set forth in claim 16 further including a protection circuit for very rapidly disabling said modulator, including a sensing means for sensing excessive audio current being amplified, together with inhibit switching means coupled to said sensing means for generating a fixed interval inhibit signal upon the sensing of excessive audio current by said sensing means, and means for coupling said inhibit signal to said disable circuit of said second differential amplifier.

23. The combination as set forth in claim 17, 18 or 19 wherein the serrated waveform has an isosceles triangular configuration and peak-to-peak voltage levels which exceed the amplitude of said audio signal until occurrence of over modulation to produce said state of missing pulses.

24. In a digital energy conversion high fidelity audio amplifier having an audio signal source for producing analog signals to be amplified, voltage controlled attenuation means, a feedback network, a modulator for converting said analog signals to a pulse width modulated train of pulses, power amplifier means for amplifying said pulse width modulated train of pulses and reconstruction filter means, said power amplifier means including a push-pull power amplifier having a negative power supply bus and a positive power supply bus and first and second amplifier devices coupled in series across said positive and negative power supply bus, reactance means coupled between said first and second amplifier devices and having a center tap, and push-pull amplifier crossover distortion compensation means comprising:

autotransformer means coupled between said center tap of said reactance means and said reconstruction filter, said autotransformer means having a first and second output terminal and a tap;

first coupling means for coupling said autotransformer tap to said center tap of said reactance means;

second coupling means for coupling said first terminal of said autotransformer means to said reconstruction filter;

third coupling means for coupling said second terminal of said autotransformer means to one of said power supply busses via a first diode;

fourth coupling means for coupling said second terminal of said autotransformer means to the other power supply bus via a second diode, said first and second diodes being back biased with respect to the polarity of the voltages upon said busses.

25. The combination as set forth in claim 24 further including a third back biased diode coupled across said reactance means and one of said amplifying devices together with a fourth back biased diode coupled across said reactance means and the other of said amplifying devices.

26. The combination as set forth in claims 24 or 25 wherein said reactance means comprises first and second inductors coupled together at said center tap.

27. The combination a set forth in claims 1, 2, 3, 7, 15, 16, 17, 18 or 22 wherein said reconstruction filter means includes a low pass filter means for recovering said audio signal amplified by said power amplifier means and notch filter means for eliminating at least the fundamental frequency component of the switching frequency of said power amplifier means.

28. The combination as set forth in claim 27 further including variable reactor means for tuning at least one section of said notch filter means, and means for coupling said variable reactor means to said feedback network to enable reduction of output distortion by observing the output signal from said audio amplifier while actuating said variable reactor means.

29. The combination as set forth in claim 28 further including damping means coupled to said variable reactor means for damping the Q of said section of said notch filter to facilitate the observation and correction of said output signal.

30. The combination as set forth in claim 28 wherein said power amplifier means includes a push-pull power amplifier having a negative power supply bus and a positive power supply bus and first and second amplifier devices coupled in series across said positive and negative power supply bus, first reactance means coupled between said first and second amplifier devices and having a center tap, and push-pull amplifier crossover distortion compensation means comprising:

second inductive reactance means coupled between said center tap of said first reactance means and said reconstruction filter, said second inductive reactance means having a first and second terminal and a tap;

first coupling means for coupling said tap to said center tap of said first reactance means;

second coupling means for coupling said first terminal of said second inductive reactance means to said reconstruction filter;

third coupling means for coupling said second terminal of said second inductive reactance means to one of said power supply busses via a first diode;

fourth coupling means for coupling said second terminal of said second inductive reactance means to the other power supply bus via a second diode, said first and second diodes being back biased with respect to the polarity of the voltages upon said busses.

31. The combination as set forth in claim 30 further including a third back biased diode coupled across said first reactance means and one of said amplifying devices together with a fourth back biased diode coupled across said first reactance means and the other of said amplifying devices.

32. The combination as set forth in claim 31 wherein said first reactance means comprises first and second inductors coupled together at said center tap.

33. The combination as set forth in claim 27 wherein said reconstruction filter means further includes an R.F. filter.

34. The combination as set forth in claim 28 wherein said reconstruction filter means further includes an R.F. filter.

35. The combination as set forth in claim 30 wherein said reconstruction filter means further includes an R.F. filter.

*36. A digital energy conversion audio amplifier, comprising:*

*a feedback network responsive to an analog signal to be amplified;*

*a modulator responsive to said analog signal for converting said analog signals to pulse width-modulated trains of pulses and including first and second switching devices coupled together in a non-saturating common terminal differential amplifier configuration and responsive to said analog signals and a serrated waveform controlling the pulse width modulation of said analog signals, and power amplifier means for amplifying said pulse width-modulated trains of pulses;*

*reconstruction filter means responsive to the amplified trains of pulses for recovering the analog signals;*

*means for coupling a signal from said reconstruction filter means to said feedback network to eliminate closed loop distortion; and*

*further comprising voltage controlled attenuator means responsive to an analog signal to be amplified and proving an analog output representative thereof and distortion detection means responsive to the pulse width-modulated trains of pulses to detect pulses missing therefrom and controlling said voltage controlled attenuator to attenuate the analog signal to be amplified.*

*37. The digital energy conversion audio amplifier as claimed in claim 36, further comprising means for monitoring the amplified trains of pulses from said power amplifier means and disabling said modulator upon detection of an excessive signal level in said power amplifier means.*

*38. A digital energy conversion audio amplifier, comprising:*

*a feedback network responsive to an analog signal to be amplified;*

*a modulator responsive to said analog signal for converting said analog signals to pulse width-modulated trains of pulses and including first and second switching devices coupled together in a non-saturating common terminal differential amplifier configuration and responsive to said analog signals and a serrated waveform controlling the pulse width modulation of said analog signals, and power amplifier means for amplifying said pulse width-modulated trains of pulses;*

*reconstruction filter means responsive to the amplified trains of pulses for recovering the analog signals;*

*means for coupling a signal from said reconstruction filter means to said feedback network to eliminate closed loop distortion; and*

*further comprising means for monitoring the amplified trains of pulses from said power amplifier means and disabling said modulator upon detection of an excessive signal level in said power amplifier means.*

*39. A digital energy conversion amplifier comprising the combination of:*

*audio signal source means for providing an audio frequency analog signal to be amplified;*

*a feedback network responsive to the audio frequency analog signal to be amplified;*

*modulator means responsive to the feedback network for providing non-saturated, power amplified, out-of-phase, pulse width-modulated trains of pulses;*

*low-pass filter means for recovering said audio signal as amplified; and*

*notch filter means responsive to the power amplified trains of pulses and connected to said feedback network prior to said low-pass filter means, said notch filter means eliminating at least the fundamental frequency component of the switching frequency of said power amplified, out-of-phase pulse-width modulated trains of pulses.*

*40. The digital energy conversion audio amplifier as claimed in claim 39, wherein said notch filter means includes variable reactor means.*

*41. The digital energy conversion audio amplifier as claimed in claim 40, further including damping means coupled to said variable reactor means for damping the Q of said section of said notch filter.*

* * * * *

UNITED STATES PATENT AND TRADEMARK OFFICE

CERTIFICATE OF CORRECTION

PATENT NO. : Re. 33,333

DATED : September 11, 1990

INVENTOR(S) : Wilson E. Taylor, Larry E. Hand & Brian E. Attwood

It is certified that error appears in the above-identified patent and that said Letters Patent is hereby corrected as shown below:

On the title page item [75] Inventors: add --Brian E. Attwood-- as a co-inventor.

Signed and Sealed this

Eighteenth Day of February, 1992

*Attest:*

HARRY F. MANBECK, JR.

*Attesting Officer*

*Commissioner of Patents and Trademarks*